(12) United States Patent
Conte et al.

(10) Patent No.: US 7,130,219 B2
(45) Date of Patent: Oct. 31, 2006

(54) ELECTRICALLY WORD-ERASABLE NON-VOLATILE MEMORY DEVICE, AND BIASING METHOD THEREOF

(75) Inventors: Antonino Conte, Tremestieri Etneo (IT); Mario Micciche', Agrigento (IT); Alberto José Di Martino, Siracusa (IT); Alfredo Signorello, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/067,478

(22) Filed: Feb. 25, 2005

(65) Prior Publication Data

US 2005/0195654 A1   Sep. 8, 2005

(30) Foreign Application Priority Data

Feb. 27, 2004   (EP) ................................. 04425123

(51) Int. Cl.
  *G11C 16/04* (2006.01)
(52) U.S. Cl. .......................... 365/185.18; 365/185.05; 365/185.13
(58) Field of Classification Search ........... 365/185.18, 365/185.01, 185.05, 185.11, 185.12, 185.13
  See application file for complete search history.

(56) References Cited

U.S. PATENT DOCUMENTS

| 5,455,790 | A | | 10/1995 | Hart et al. ............. 365/185.11 |
|---|---|---|---|---|
| 5,818,764 | A | * | 10/1998 | Yiu et al. ............... 365/185.11 |
| 5,917,757 | A | | 6/1999 | Lee et al. ............... 365/185.33 |
| 6,532,171 | B1 | * | 3/2003 | Gastaldi et al. ........ 365/185.12 |
| 6,618,315 | B1 | | 9/2003 | Pio et al. ................ 365/230.01 |
| 6,888,190 | B1 | * | 5/2005 | Yang et al. .................. 257/314 |
| 7,006,381 | B1 | * | 2/2006 | Dormans et al. ...... 365/185.28 |
| 2002/0154546 | A1 | | 10/2002 | Pio et al. ................ 365/185.28 |

FOREIGN PATENT DOCUMENTS

| EP | 1 178 491 A1 | 2/2002 |
|---|---|---|
| WO | WO 03/047163 A2 | 6/2003 |

* cited by examiner

*Primary Examiner*—Gene N. Auduong
(74) *Attorney, Agent, or Firm*—Lisa K. Jorgenson; David V. Carlson; Seed IP Law Group PLLC

(57) ABSTRACT

A memory device formed by an array of memory cells extending in rows and columns. The device is formed by a plurality of N-type wells extending parallel to the rows; each N-type well houses a plurality of P-type wells extending in a direction transverse to the rows. A plurality of main bitlines extend along the columns. Each P-type well is associated to a set of local bitlines that extend along the respective P-type well and are coupled to the drain terminals of the cells accommodated in the respective P-type well. Local-bitlines managing circuits are provided for each P-type well and are located between the main bitlines and a respective set of local bitlines for controllably connecting each local bitline to a respective main bitline.

25 Claims, 3 Drawing Sheets

| | Status | LBL | SV[V] | PWA[V] | $Y_0$[V] | $Y_{OC}$[V] |
|---|---|---|---|---|---|---|
| Erase Charge | SSM | Source/ Floating | 4→10 | 4→10 | 5 | 5 |
| Erase Discharge | SSM | Source | 10→0 | 10→0 | 5 | 5 |
| Program | SSM | MBL | 0 | -1.4 | 9 | 0 |
| Read | SSM | MBL | 0 | 0 | 5 | 0 |
| Verify | SSM | MBL | 0 | -1.4 | 5 | 0 |
| Erase Charge | USM | Source | -1.8 | -1.8 | -1.8 | 5 |
| Erase Discharge | USM | Source | -1.8 | -1.8 | -1.8 | 5 |
| Program | USM | Floating | 0 | 0 | 0 | 0 |
| Read | USM | Floating | 0 | 0 | 0 | 0 |
| Verify | USM | Floating | 0 | 0 | 0 | 0 |
| Erase Charge | UUM | Source | 0 | 0 | 0 | 5 |
| Erase Discharge | UUM | Source | 0 | 0 | 0 | 5 |
| Program | UUM | Floating | 0 | 0 | 0 | 0 |
| Read | UUM | Floating | 0 | 0 | 0 | 0 |
| Verify | UUM | Floating | 0 | 0 | 0 | 0 |

Fig. 5

ELECTRICALLY WORD-ERASABLE NON-VOLATILE MEMORY DEVICE, AND BIASING METHOD THEREOF

BACKGROUND OF THE INVENTION

1. Field of the Invention

The present invention relates to an electrically word-erasable non-volatile memory device, and to the biasing method thereof. In particular, the invention relates to a flash memory device.

2. Description of the Related Art

As is known, generally flash memories can be erased only by sectors, typically 512-Kbit sectors, while they can be programmed with a granularity that arrives at the single bit. In other flash memories it is possible to carry out erasing by pages that contain a certain number of words. Moreover, recently flash memories have been proposed that enable erasing of single words.

For example, in EP-A-1178491, a flash memory is described, in which the memory cells, instead of being formed in a single doped semiconductor region, normally of P-type for N-channel memory cells, are formed in a plurality of P-wells, in turn accommodated in an N-type well. See, in this connection, FIGS. 1 and 2, which illustrate the simplified diagram and a cross-section through a portion of a memory device described in EP-A-1 178 491. In these figures, a substrate 1 of P-type accommodates an N-type well 2, in turn accommodating a plurality of P-wells 3.

As may be noted in particular in FIG. 1, the P-wells 3 have the shape of vertical strips that extend alongside one another in a direction transverse to the rows. Source regions 4 and drain regions 5 are formed within the P-wells 3 (FIG. 2).

The memory columns are connected to bitlines BL grouped in packets CP, one for each P-well (FIG. 1). Then, memory cells arranged on a same row (and hence connected to a same wordline WL) are divided into a plurality of subsets, each subset being made up of the memory cells formed in a same P-well 3. In this type of architecture, the memory cells that are arranged on a same row and are provided in a same P-well form a single word.

Thereby, it is possible to word-erase the memory, selecting just one of the P-wells and applying a high negative voltage to the wordline to which the word to be erased is connected.

In the document cited, it is moreover proposed to provide a plurality of "physical sectors", each accommodated in an own N-well. The overall architecture is not, however, described precisely. Each "physical sector" is equipped with its own reading and programming circuits (sense amplifiers and program loads), so that the structure as a whole requires quite a lot of space, and it is not indicated how to manage the different "physical sectors" during erasing of a word so as to prevent problems of undesirable erasing or stresses on the non-selected sectors. Furthermore, to eliminate the stress induced in memory word cells that are not to be erased but are provided in the same "physical sector" as the word to be erased, a complex refreshing mechanism is proposed.

BRIEF SUMMARY OF THE INVENTION

The aim of the invention is thus to improve the page erasing of memory devices.

According to the present invention, there are provided electrically word-erasable non-volatile memory devices.

In one embodiment, the memory device includes an array of memory cells extending in rows and columns. The memory device comprises a plurality of first wells of a first conductivity type extending along the rows. Each first well accommodates a plurality of second wells of a second conductivity type extending in a direction transverse to the rows. Each second well is associated to a set of local bitlines and a local-bitlines managing circuit, which controllably connects each local bitline to a respective main bitline extending along the columns.

In another embodiment, the memory device has the same configuration but not having the limitations on well structure. Therefore, the memory device of this embodiment comprises a plurality of main bitlines extending along the columns, a plurality of sets of local bitlines and a plurality of local-bitlines managing circuits. Each local-bitlines managing circuit controllably connects each local bitline to a respective main bitline.

According to the present invention, there is also provided a biasing method as defined in claim 13.

In one embodiment, the biasing method comprises a step of electrically coupling a local bitline coupled to an addressed memory cell to a respective main bitline during programming, reading and verifying.

BRIEF DESCRIPTION OF THE SEVERAL VIEWS OF THE DRAWING(S)

For understanding the present invention, a preferred embodiment thereof is now described, purely by way of non-limiting example, with reference to the attached drawings, wherein:

FIG. 5 shows a table of the biasing voltages of the memory device of FIG. 3.

DETAILED DESCRIPTION OF THE INVENTION

Figure 2:
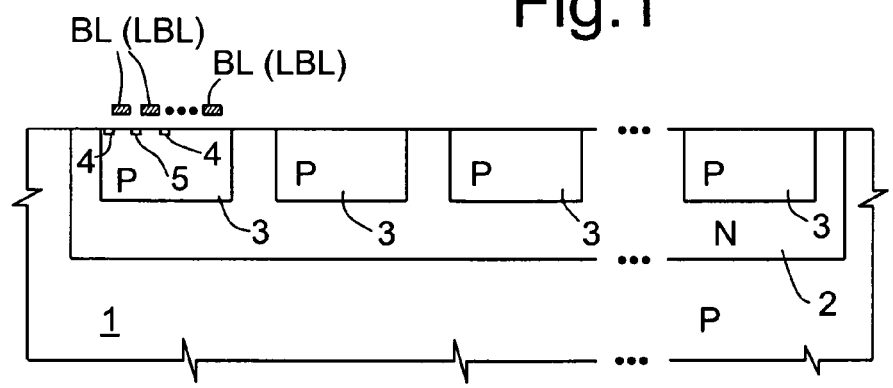
FIG. 2 shows a cross-section through a semiconductor device implementing the sector of FIG. 1.
Figure 3:
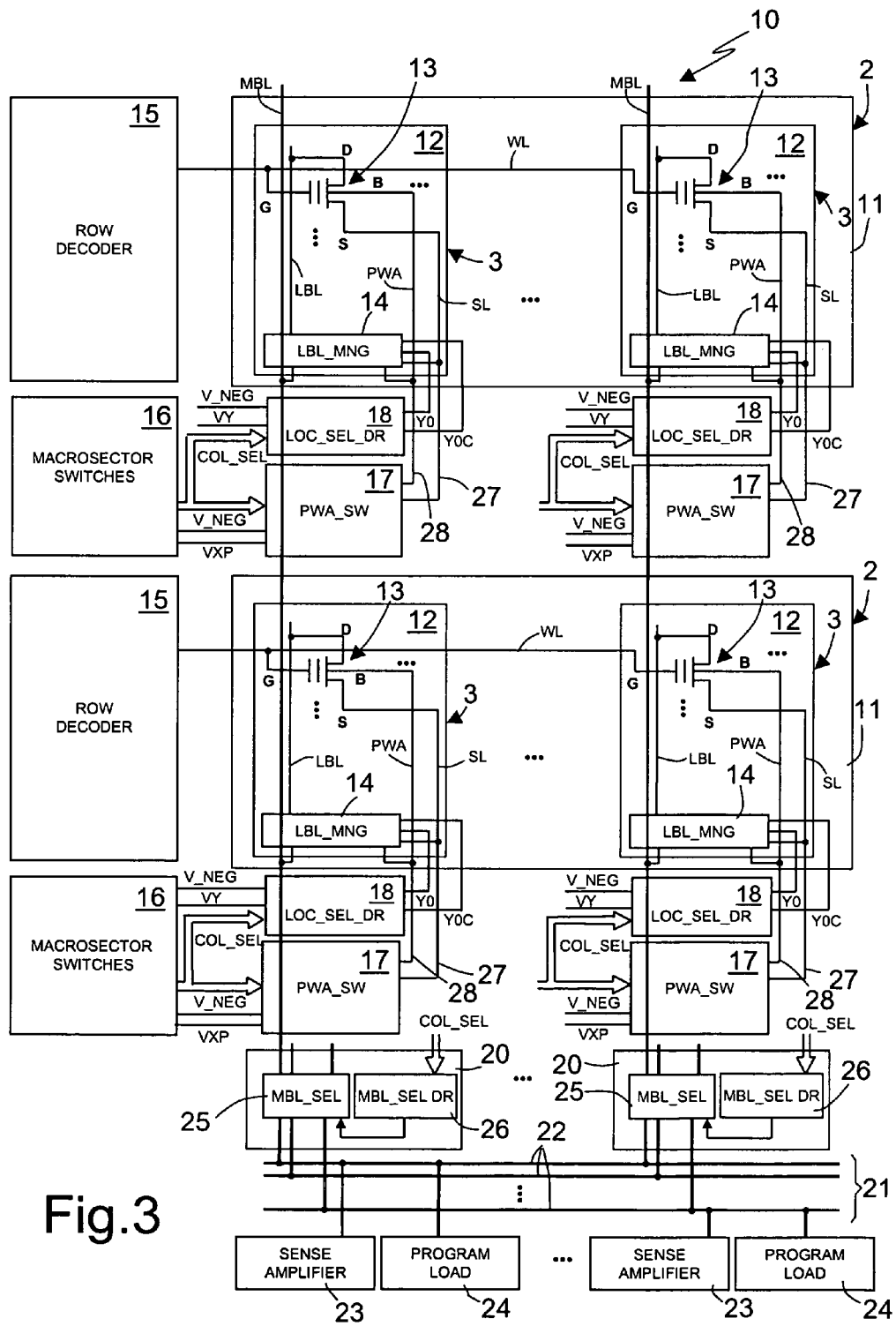
FIG. 3 shows a simplified diagram of the architecture of the memory device according to an embodiment of the invention.

With reference to FIG. 3, a memory 10 of flash type comprises a plurality of macrosectors 11 (in the example illustrated two macrosectors 11). The structure of each macrosector 11 corresponds to the known structure illustrated in FIGS. 1 and 2, to which reference will be made hereinafter as regards the physical structure.

Each macrosector 11 is accommodated in an own N-well 2 (FIG. 2) and forms a plurality of sectors 12, each accommodated in a own P-well 3. Each sector 12 is thus formed by a plurality of memory cells 13 (just one whereof is illustrated for each sector 12) accommodated in the same P-well 3. As a whole, the memory cells 13 form an array of cells arranged in rows and columns. Each memory cell 13 (of a known structure and hence not illustrated in detail) has a gate electrode G connected to a respective wordline WL, a drain region D connected to a respective local bitline LBL, a source region S connected to a common source line 27 and a bulk terminal B, which represents the common biasing terminal of the P-well 3 of FIG. 2 and is connected to a bulk-biasing line 28.

Figure 1:
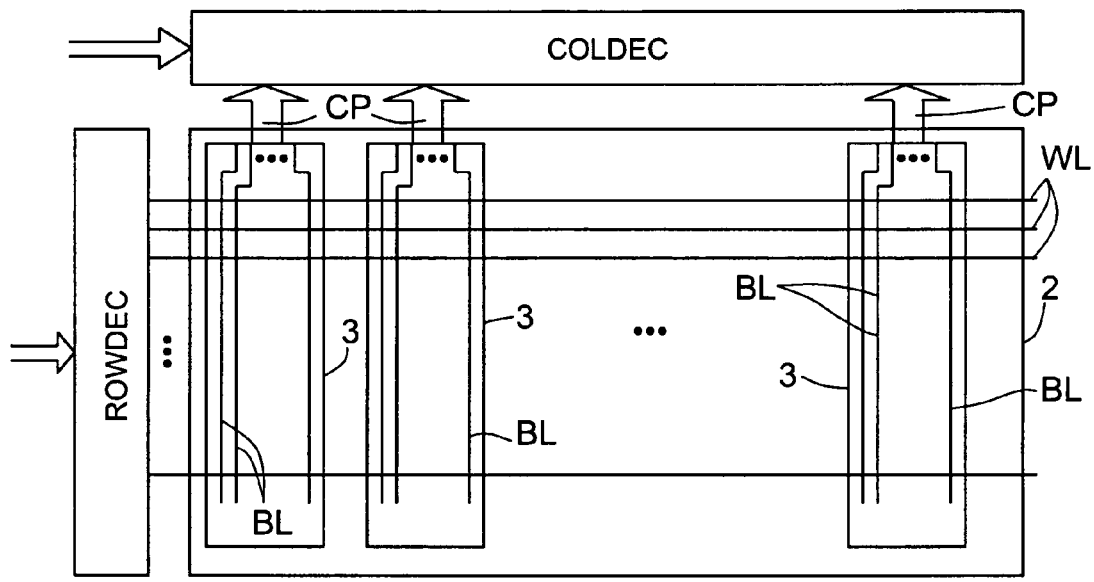
FIG. 1 shows the structure of a sector of a flash memory with single-word erasing, of known type.

Each sector 12 has a plurality of wordlines WL and a plurality of local bitlines LBL (just one whereof is illustrated for each sector 12), in a way similar to the bitlines BL of FIG. 1. The memory cells 13 belonging to the same sector 12 and arranged on the same row (connected to the same wordline WL, but to different local bitlines LBL) form a word of the memory 10.

Each macrosector 11 comprises a number of memory cells 13 which is linked to two important factors that depend basically upon the technology employed, namely:

1. tolerance to the bitline leakage, which affects the maximum number of wordlines; and 2. tolerance to the erase stress of the memory cells that are not to be erased but are arranged on the same row as the word to be erased; this factor affects the maximum number of P-wells 3.

For example, a memory 1 produced by the present applicant comprises, for each macrosector 11, 512 wordlines and 32 P-wells 3, for a 512-Kbit storage capacity in two-level technology. The memory produced moreover has four macrosectors 11, for a total overall capacity of 2 Mb.

According to FIG. 3, the memory 10 comprises a plurality of main bitlines MBL, one for each column of the memory 10. The main bitlines MBL extend over all the macrosectors 11 and are connected with the local bitlines LBL of each sector 12 through local-bitlines managing units (LBL_MNG) 14 accommodated within respective P-wells 3. A single unit LBL_MNG 14 can manage a single local bitline or alternatively a plurality of local bitlines. In one embodiment, in each sector 12, the unit LBL_MNG 14 connects each local bitline LBL to a respective main bitline MBL, while a same main bitline MBL is connected to different local bitlines LBL associated in different macrosectors 11 and mutually aligned in the direction of the columns.

In the example illustrated, each macrosector 11 is connected to an own row decoder 15 and an own macrosector-switch block 16. Furthermore, each sector 11 is connected to own source/bulk-switch circuits 17 and to own local selection-driving circuits 18, as explained better hereinafter.

Finally, the main bitlines MBL are connected by column-decoding circuits 20 to a bus 21 formed, for example, by 38 bus lines 22 (32 bitlines+6 parity lines) connected, during reading, to reading circuits formed by sense amplifiers 23 and, during writing, to writing circuits comprising program loads 24.

Figure 4:
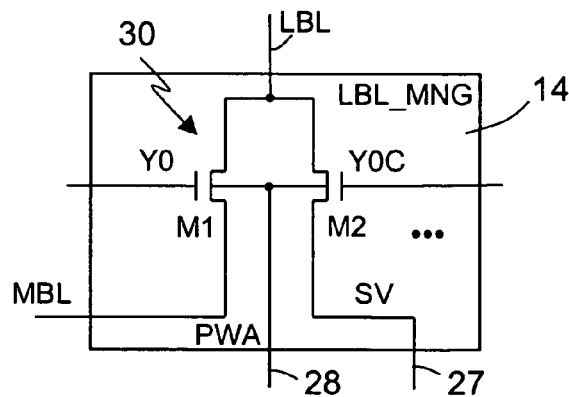
FIG. 4 shows the detail of a unit of the memory device of FIG. 3.

The units LBL_MNG 14 are made up of a plurality of connection circuits 30 (one whereof is illustrated in FIG. 4 and described in detail hereinafter). The connection circuits 30 are equal in number to the local bitlines LBL and have the aim of either connecting the respective local bitline LBL to the main bitline MBL or leaving it floating or connecting it to the common source line in the various operating steps, as will be explained in greater detail hereinafter.

In detail (FIG. 4), each connection circuit 30 comprises a selection transistor M1 and a clamp transistor M2, both of MOS type. The selection transistor M1 has a first terminal connected to the respective main bitline MBL, a second terminal connected to the respective local bitline LBL, a gate terminal receiving a selection signal Y0 from the respective local-selection-driving circuit 18 and a bulk terminal connected to the bulk-biasing line 28. The clamp transistor M2 has a first terminal connected to the common source line 27, a second terminal connected to the respective local bitline LBL, a gate terminal receiving a clamp signal Y0C from the respective local-selection-driving circuit 18, and a bulk terminal connected to the bulk-biasing line 28.

The macrosector-switch blocks 16 contain the circuits for selecting the sectors 12 belonging to a same macrosector 11 and generate sector-selection signals COL_SEL sent to the units MBL_SEL_DR 26 and to the source/bulk-switch circuits 17; moreover, they generate negative voltages V_NEG and positive voltages VY and VXP necessary for operation of the source/bulk-switch circuits 17 and the local selection-driving switch circuits 18.

The source/bulk-switch circuits (PWA_SW) 17 are substantially made up of switches, which are selected via the sector-selection signals COL_SEL and receive the negative voltage V_NEG and the positive voltage VXP necessary for biasing the bulk terminal B (bulk voltage PWA supplied on the bulk-biasing line 28) and the source terminal S (source voltage SV supplied on the source-biasing line 27) of all the memory cells 13 belonging to its own sector 12, for carrying out erasing, programming, reading and verifying, which will be explained hereinafter with reference to the table of FIG. 5. The switches belonging to the circuits PWA_SW 17 are designed to support voltages higher than the maximum ones allowed by the technology (maximum absolute rating).

The local selection-driving circuits (LOC_SEL_DR) 18 have the aim of generating the column-selection signals Y0 and clamp signals Y0C for the connection circuits 30. At a circuit level, they are made up of a plurality of level shifters, which are controlled by the respective macrosector-switch block 16 through the signals COL_SEL and receive the necessary negative voltage V_NEG and positive voltage VY, as illustrated in the table of FIG. 5 and explained in greater detail hereinafter.

The column-decoding circuits 20 are each formed by a main-bitline-selection unit (MBL_SEL) 25 and by a main-bitline-selector-driving unit (MBL_SEL_DR) 26. In a per se known manner, the units MBL_SEL 25 are formed by switches having the aim of electrically connecting the selected main bitlines MBL to the bus 21, during both reading and writing. The units MBL_SEL_DR 26 are formed by level shifters that supply the driving voltages necessary for the units MBL_SEL 25, according to the operating step and to this end they receive sector-selection signals COL_SEL.

The operation of the memory 10 of FIG. 3 during erasing, programming, reading and verifying will now be described with reference to FIGS. 4 and 5, distinguishing the following cases (the code used in the table of FIG. 5 appearing in brackets):

1. selected sector in a selected macrosector (SSM)
2. non-selected sector in a macrosector selected (USM)
3. non-selected sector in a macrosector non-selected (UUM)

a) Erasing a1) Selected sector (condition SSM). The selected wordline WL is biased at a high negative voltage (−9 V), while the non-selected wordlines are biased at a positive voltage (for example Vcc). Initially, during charging, the source voltages SV and bulk voltages PWA increase linearly from 4 V to 10 V, thus biasing accordingly the source terminals S and bulk terminals B of all the memory cells 13 belonging to the selected sector 11. The selection signals Y0 and clamp signals Y0C are set at 5 V and initially maintain on both the selection transistor M1 and the clamp transistor M2. Consequently, all the local bitlines LBL of the selected sector 12 and the main bitlines MBL connected thereto remain connected to the source voltages SV and bulk voltages PWA. Next, the transistors M1 and M2 turn off, but the high voltage on their bulk and source terminals turns on the respective junctions, maintaining the connection of the local bitlines LBL and the main bitlines MBL to the source voltages SV and bulk voltages PWA, but for a diode voltage drop. This effect is favored also by the turning-on of the source/bulk junctions of the memory cells 13 belonging to the selected sector 12. In this condition, the memory cells 13 connected to the selected wordline WL ("selected memory cells") are erased, and the memory cells 13 connected to the non-selected wordlines WL ("non-selected memory cells") do not undergo any erase disturbance, which were otherwise possible as a result of the biasing of the bulk region.

During discharging, the source voltages SV and bulk voltages PWA are reduced gradually in ramp-like fashion from 10 V to 0 V, discharging the source regions 4 and bulk regions 3. The selection signals Y0 and clamp signals Y0C remain at 5 V. Also in this case, as long as the source voltages SV and bulk voltages PWA remain high, the source/bulk junctions of the transistors M1 and M2 remain on; hence, as soon as the source voltages SV and bulk voltages PWA reach the value of 5 V but for a diode voltage drop, they cause turning-on both of the selection transistor M1 and of the clamp transistor M2, which maintain the local bitlines LBL and the main bitlines MBL locked to the source voltage SV. In this step, turning-on of the selection transistor M1 enables cascading of the discharge transistor of the respective main bitline MBL (not illustrated, present in the units MBL_SEL_DR 26) and hence limit the voltage on the drain terminal D of the memory cells 13. In turn, the transistor M2 enables discharge of the respective local bitline LBL, together with the P-well 3 of FIG. 2, thus preventing any stress on the drain terminal of the memory cells 13 belonging to the selected sector between the end of discharging of the P-well 3 and the start of discharging of the main bitlines MBL.

a2) Non-selected sector in a selected macrosector (condition USM). For this sector, it is necessary to apply the inhibition voltages such as to limit degradation of the thresholds of programmed memory cells arranged in the same row of the selected cells, degradation due to the stress caused by the selected wordlines and biased at a high negative voltage (−9 V). To this end, the P-well 3, the local bitlines LBL and the common source line 27 are biased at −1.8 V. Thus, the bulk voltage PWA and the source voltage SV are set at −1.8 V, the selection signal Y0 is set at −1.8 V and the clamp signal Y0C is set at 5 V. Consequently, the clamp transistor M2 is turned on, and biases the associated local bitline LBL in the desired way, while the selection transistor M1 is turned off and isolates the local bitline LBL from the respective main bitline MBL. This separation is necessary to prevent the associated main bitline MBL from being biased also at −1.8 V, which would involve a direct biasing of the drain junction of a connection circuit 30 that is connected to a non-selected sector 12, located in a non-selected macrosector 11 that shares the same main bitline MBL.

a3) Non-selected sector in a non-selected macrosector (condition UUM). For this sector it is necessary for the driving voltage of the selection signal Y0 to be non-negative, in so far as the P-well 3 is at ground potential, and a possible negative voltage could cause breakdown of the drain junction of the transistor M1 in cycling. To this end, the selection signal Y0 is set at 0 V, thus simplifying the circuit implementation of the driving device that generates the selection signal Y0 (obtained within the respective circuit LOC_SEL_DR 18). Alternatively, it is possible to set the selection signal Y0 to a slightly positive voltage, for example 1 V, so as to increase the breakdown voltage of the transistor M1, without disturbing the memory cells 13 with a positive voltage that is too high (in fact, in the worst case, with Y0=1 V, the corresponding local bitline LBL would be biased to 0.4 V). Instead, the clamp signal Y0C is set at 5 V, so that the clamp transistor M2 is turned on and connects its own local bitline LBL to the common source line 27 and thus forces the local bitline LBL to 0 V. In this way, should the associated main bitline MBL be biased at a high voltage (i.e. should this main bitline MBL extend over a selected sector, see condition a1), this bitline is prevented from inducing, by capacitive coupling, a voltage on the local bitline LBL, as instead would be possible if the latter were floating. Said solution thus enables prevention a drain stress, with negative conditions in cycling.

b) Programming, Reading and Verifying

The units LBL_MNG 14 enable selection and biasing of the local bitlines LBL in a traditional way through the selection transistor M1, while the clamp transistor M2 is always off. In a similar way, the common source lines 27 and bulk lines 28 are biased in a traditional way.

The advantages of the memory described are the following. First, it is possible to carry out word-erasing with times comparable to those of an EPROM in a flash memory equipped with a number of macrosectors, without creating any disturbance to the non-erased cells. This is obtained by means of an appropriate management of the erase ramp supplied to the source terminal and to the bulk terminal of the selected sector, with voltages that exceed the ones used for standard flash memories and in particular exceed the limits currently imposed on the technology. The connections of the source, drain and bulk terminals of the non-selected cells moreover guarantee that these will not undergo any stress.

In a similar way, in the case of selected sectors, the connection of the local bitlines LBL of the selected cells to the common source line 27 during discharge after erasing causes the local bitlines to be brought to the same potential as the selected P-well 3 (but for a diode voltage drop), on account of the direct biasing of the drain junctions of the memory cells. In this way, the local bitlines are not floating and cannot be brought up to high potentials, so causing a stress of the memory cells that are connected to the same local bitlines.

Finally, it is clear that numerous modifications and variations may be made to the memory device and biasing method described and illustrated herein, all of which fall within the scope of the invention, as defined in the annexed claims.

For example, even though the foregoing description refers to the case of main bitlines MBL extending throughout the height of the columns of the memory array, in the case of a large number of macrosectors 11, for example eight, it is possible split the memory array into two parts, a top one and a bottom one, each equipped with its own main bitlines MBL aligned with respect to one another and with their own reading and programming circuits.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A memory device of an electrically word-erasable non-volatile type, comprising:
   an array of memory cells arranged in a plurality of rows and columns, each memory cell having a drain terminal, a source terminal, and a bulk terminal;
   a plurality of first wells of semiconductor material of a first conductivity type, extending parallel to the rows;
   a plurality of sets of second wells of semiconductor material of a second conductivity type and accommodating said memory cells, each set of second wells extending within a respective one of said first wells, each second well extending in a direction transverse to said rows and accommodating a respective set of memory cells forming a sector;
   a plurality of main bitlines extending along the columns of said array;
   a plurality of sets of local bitlines, each set of local bitlines being associated to a respective second well, each local bitline being coupled to the drain terminal of memory cells accommodated in said respective second well and aligned along one of said columns; and
   a plurality of local-bitline managing circuits, one for each second well, coupled between said main bitlines and said sets of local bitlines for controllably coupling each local bitline to a respective main bitline.

2. The memory device according to claim 1, wherein each local-bitline managing circuit is located between the main bitlines and a respective set of local bitlines to which it is coupled.

3. The memory device according to claim 1, further comprising:
   a bus;
   a plurality of main-bitline-selection units coupled between said main bitlines and said bus; and
   a plurality of reading and programming circuits coupled to said bus.

4. The memory device according to claim 3, wherein said main bitlines are divided into sets, each set of main bitlines being coupled to second wells aligned parallel to said columns and to a respective main-bitline-selection unit.

5. The memory device according to claim 3, wherein said bus has a plurality of bus lines, and each main-bitline-selection unit has a plurality of connection lines, each connection line being coupled to a respective bus line; each said reading and programming circuit being coupled to a respective one of said bus lines.

6. The memory device according to claim 1, wherein the source terminals and bulk terminals of said memory cells, accommodated in a single second well, are coupled to a source-biasing line and, respectively, to a bulk-biasing line said local-bitline managing circuits comprising switch means for selectively decoupling a respective local bitline from a respective main bitline and coupling it to said source-biasing line.

7. The memory device according to claim 6, further comprising:
   a local-selection-driving circuit for each second well, each said local-selection-driving circuit generating a first control signal for said switch means of a respective local-bitline managing circuit for coupling a respective local bitline to said source-biasing line during an erase-discharge step in the case of selected sector; and for coupling a respective local bitline to said source-biasing line during erasing in case of non-selected sector.

8. The memory device according to claim 7, wherein each of said local-selection-driving circuits generates a second control signal for said switch means of a respective local-bitline managing circuit for coupling a respective local bitline to a respective main bitline during an erase-discharge step in the case of selected sector.

9. The memory device according to claim 8, wherein each local-bitline managing circuit comprises:
   a first transistor having a first terminal coupled to a respective main bitline, a second terminal coupled to a respective local bitline, a control terminal coupled to said local-selection-driving circuit and receiving said second control signal, and a bulk terminal coupled to said bulk-biasing line; and
   a second transistor having a first terminal coupled to said source-biasing line, a second terminal coupled to a respective local bitline, a control terminal coupled to said local-selection-driving circuit and receiving said first control signal, and a bulk terminal coupled to said bulk-biasing line.

10. The memory device according to claim 1, wherein said local-bitline managing circuits are each formed in a respective second well.

11. The memory device according to claim 7, further comprising:
   a source/bulk-switch circuit for each second well, said source/bulk-switch circuits generating source voltages and bulk voltages, supplied to said source-biasing lines and bulk-biasing lines.

12. The memory device according to claim 11, further comprising:
   a macrosector-switch block for each first well, said macrosector-switch block generating sector-selection signals, supplied to respective source/bulk-switch circuits and to respective local-selection-driving circuits, and negative voltages and positive voltages supplied to said respective source/bulk-switch circuits and to said respective local-selection-driving circuits.

13. A biasing method of an electrically word-erasable non-volatile memory device, comprising:
   at least one array of memory cells arranged in a plurality of rows and columns, each memory cell having a drain terminal, a source terminal, and a bulk terminal;
   a plurality of first wells of semiconductor material of a first conductivity type, extending parallel to the rows;
   a plurality of sets of second wells of semiconductor material of a second conductivity type and accommodating said memory cells, each set of said second wells extending within a respective one of said first wells, each second well extending in a direction transverse to said rows;
   a plurality of main bitlines extending along the columns of said memory device; and
   a plurality of sets of local bitlines, each set of local bitlines being associated to a respective second well, each local bitline being coupled to the drain terminal of memory cells, accommodated in said respective second well and aligned along one of said columns,
   the method comprising the steps of:
   addressing a memory cell; and
   electrically coupling a local bitline coupled to said memory cell addressed to a respective main bitline during programming, reading and verifying.

14. The method according to claim 13, wherein erasing includes a charging period and a discharging period and comprises the steps of:
- selecting at least one memory cell to be erased;
- supplying an erase source voltage to the source terminal of said memory cell to be erased; and
- supplying said erase source voltage to a local bitline coupled to said memory cell to be erased during said discharging period.

15. The method according to claim 14, wherein said erase source voltage has a ramp-like increasing pattern in said charging period and a ramp-like decreasing pattern in said discharging period.

16. The method according to claim 15, wherein said erase source voltage increases from 4 V to 10 V in said charging period and decreases from 10 V to 0 V in said discharging period.

17. The method according to claim 14, wherein, during erasing, said bulk terminal of said selected memory cell is brought to said erase source voltage.

18. The method according to claim 14, wherein erasing further comprises the steps of:
- supplying an inhibition source voltage to the source terminal of a non-selected memory cell, accommodated in a different second well but in a same first well of said selected memory cell; and
- supplying said inhibition source voltage to a local bitline coupled to said non-selected memory cell.

19. The method according to claim 18, wherein said inhibition source voltage is a negative voltage.

20. The method according to claim 18, wherein said inhibition source voltage is equal to −1.8 V.

21. The method according to claim 18, wherein, during erasing, said bulk terminal of said non-selected memory cell is brought to said inhibition source voltage.

22. The method according to claim 14, wherein erasing further comprises the steps of:
- supplying a turn-off source voltage to the source terminal of a non-selected memory cell, accommodated in a different second well and in a different first well with respect to said selected memory cell; and
- supplying said turn-off source voltage to a local bitline coupled to said non-selected memory cell.

23. The method according to claim 22, wherein said turn-off source voltage is a non-negative voltage.

24. The method according to claim 22, wherein said turn-off source voltage is chosen between 0 V and 1 V.

25. The method according to any one of claims 22, wherein, during erasing, said bulk terminal of said non-selected memory cell is grounded.

* * * * *